United States Patent
Cheng et al.

(10) Patent No.: US 8,375,271 B2
(45) Date of Patent: Feb. 12, 2013

(54) METHOD AND APPARATUS FOR PROVIDING ADAPTIVE CYCLIC REDUNDANCY CHECK COMPUTATION

(75) Inventors: Jung-Fu Cheng, Cary, NC (US); Mats Åhlander, Taby (SE); Christer Aalto, Tokyo (JP)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 374 days.

(21) Appl. No.: 12/739,854

(22) PCT Filed: Oct. 23, 2008

(86) PCT No.: PCT/IB2008/002836
§ 371 (c)(1),
(2), (4) Date: Apr. 26, 2010

(87) PCT Pub. No.: WO2009/053825
PCT Pub. Date: Apr. 30, 2009

(65) Prior Publication Data
US 2010/0251082 A1      Sep. 30, 2010

Related U.S. Application Data
(60) Provisional application No. 60/982,952, filed on Oct. 26, 2007.

(51) Int. Cl.
*G06F 11/00* (2006.01)
(52) U.S. Cl. ............ 714/758
(58) Field of Classification Search ............ None
See application file for complete search history.

(56) References Cited

U.S. PATENT DOCUMENTS

| | | | | |
|---|---|---|---|---|
| 7,793,194 | B2 * | 9/2010 | Seo et al. | 714/776 |
| 7,992,073 | B2 * | 8/2011 | Orio | 714/774 |
| 8,074,150 | B2 * | 12/2011 | Buckley et al. | 714/781 |
| 2003/0123409 | A1 * | 7/2003 | Kwak et al. | 370/335 |
| 2009/0070653 | A1 * | 3/2009 | Kim et al. | 714/758 |
| 2009/0077456 | A1 * | 3/2009 | Pi et al. | 714/807 |

OTHER PUBLICATIONS

Anonymous: "3GPP TS 36.212, Technical Specification Group Radio Access Network; Multiplexing and channel coding (Release 8)" 3rd Generation Partnership Project Technical Specification Group Radio Access Network; , May 2007, XP002519790 the whole document.

* cited by examiner

*Primary Examiner* — Michael Maskulinski (57) ABSTRACT

A method and apparatus for providing adaptive cyclic redundancy check (CRC) computation is disclosed. A transport block size is determined. Transport block (TB) CRC bits are computed with a first CRC generator when the TB size is less than or equal to a predetermined threshold. TB CRC bits are computed with a second CRC generator when the transport block size is greater than the predetermined threshold. When the TB is greater than the predetermined threshold, the TB is segmented into code blocks (CBs) and CB CRC bits are computed with the first CRC generator. A method and apparatus for handling adaptively cyclic redundancy check (CRC) encoded transport blocks (TBs) is also disclosed. A TB is received. The TB is CRC checked based on a first CRC generator when the TB size is less than or equal to a predetermined threshold. Code blocks of the TB are CRC checked based on the first CRC generator when the TB size is greater than the predetermined threshold. When the TB size is greater than the predetermined threshold, the code blocks are concatenated, and the TB is CRC checked based on a second CRC generator.

18 Claims, 8 Drawing Sheets

Transport block size ≤ predetermined threshold

Transport block size > predetermined threshold

METHOD AND APPARATUS FOR PROVIDING ADAPTIVE CYCLIC REDUNDANCY CHECK COMPUTATION

CROSS-REFERENCE TO RELATED APPLICATIONS

This application claims the benefit of U.S. Provisional Application No. 60/982,952, filed Oct. 26, 2007, the disclosure of which is incorporated herein by reference.

TECHNICAL FIELD

The present invention relates to turbo encoding/decoding. More particularly, and not by way of limitation, the present invention is directed to an apparatus and method for providing adaptive cyclic redundancy check computation.

BACKGROUND

Figure 1:
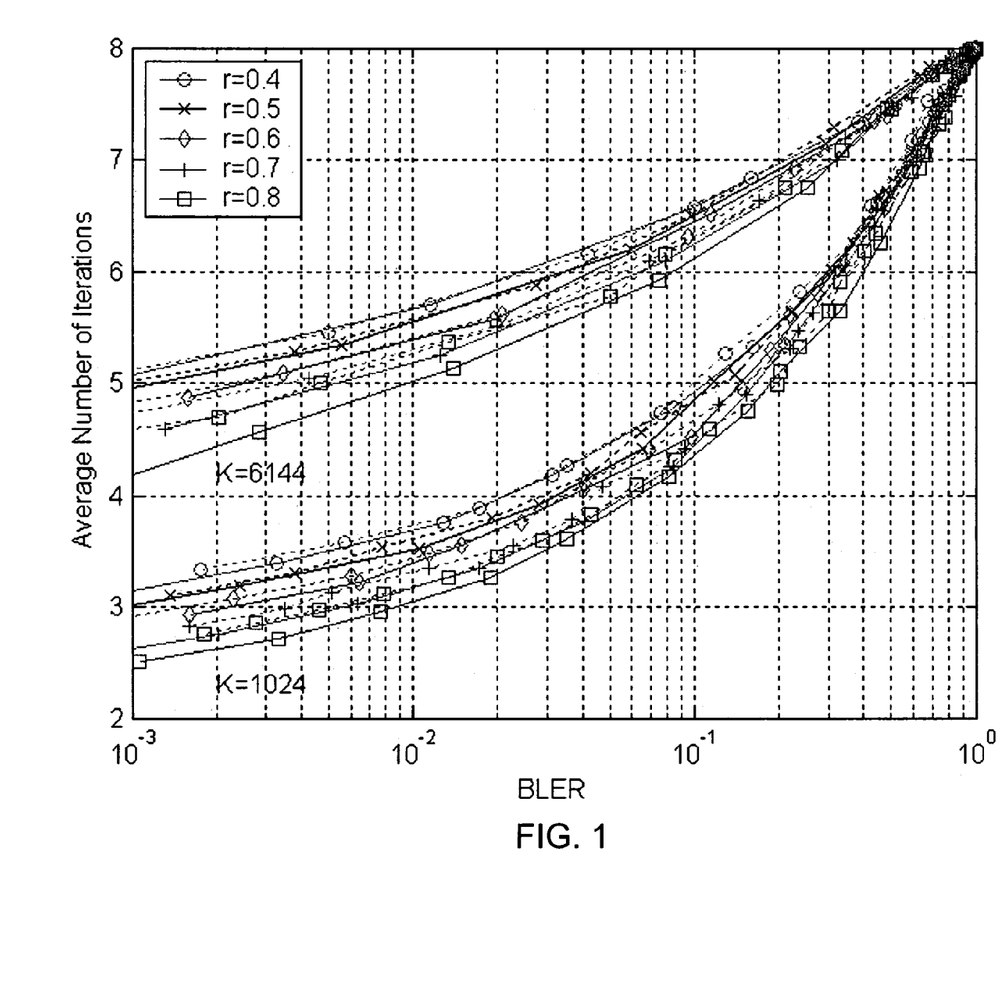
FIG. 1 illustrates a plot of average number of turbo decoding iterations for a given Block Error Rate (BLER)

It has long been observed that the average operational complexity of a turbo decoder can be significantly less than that indicated by the maximum decoding iterations. That is, error-free decoding is frequently achieved with less than Imax iterations and more iterations are only needed to cover events where the received frames are particularly noisy and the iterative decoding algorithm converges slowly. Therefore, if the correctness of a data block can be detected at the end of each iteration to abort the iterative processor, the average operational complexity can be reduced without any performance penalty. As the numerical results shown in FIG. 1, the reduction in average complexity can be quite substantial. FIG. 1 illustrates a plot of average number of turbo decoding iterations for a given Block Error Rate (BLER). Additive White Gaussian Noise (AWGN) channel results are plotted with solid lines and Rayleigh fading channel results are plotted with dashed lines.

Figure 2:
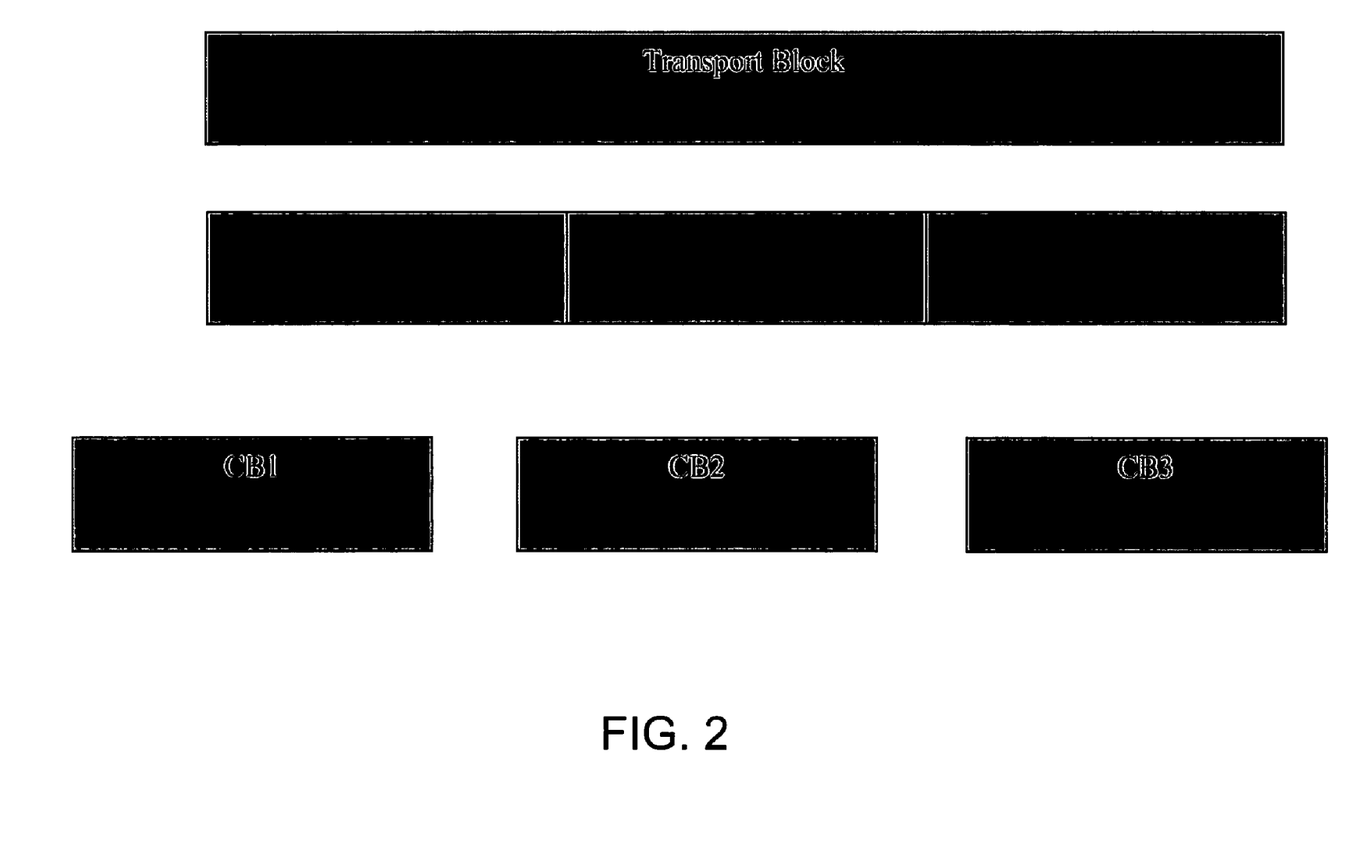
FIG. 2 illustrates code blocks in accordance with one embodiment.

In modern high data rate communications systems such as the of Universal Terrestrial Radio Access (UTRA) and the long term evolution of the UTRA (E-UTRA), large amount of data bits are transmitted at a time in a unit of a transport block (TB). Since it is impractical to implement turbo codecs of large block lengths, it is necessary to divide a large TB into multiple small units called code blocks (CB). This procedure is illustrated in FIG. 2. The individual CBs are then turbo encoded and decoded independently.

While many detection methods for early stopping have been studied, CRC checking with properly chosen length remains the simplest and most reliable approach. Because of the code block segmentation procedure, a more refined design is needed than those present in the prior art.

Since each CB is turbo encoded and decoded independently, it is hence necessary to attach CRC bits to each CB. With these attachments, it becomes possible to check the correctness of a CB after each turbo decoding iteration. If a CB is found to be correct, turbo decoding for the CB can be stopped and the decoder can proceed to process the next CB. On the other hand, if a CB is found to be incorrect, decoding of the rest of the TB can be aborted.

Figure 3:
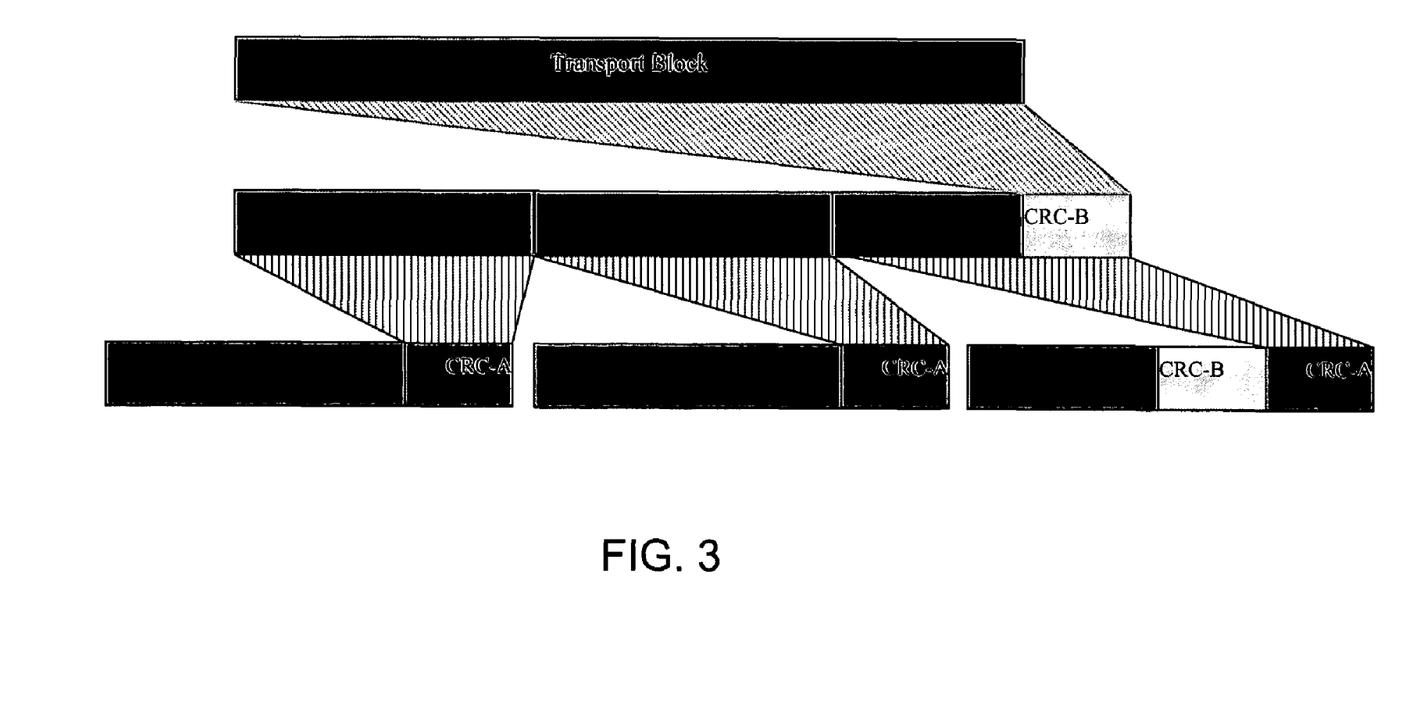
FIGS. 3 and 4 illustrate a two level CRC structure.

However, the error detection capability of CRC checking is limited by the length of the CRC attachments. In general, the error miss probability of an L-bit CRC is 2-L for large blocks. Since error misses could happen in any of the multiple CBs, the undetected error performance of the TB as a whole increases linearly with the number of CBs. It is hence necessary to introduce a second check on the TB to ensure data integrity. This two-level CRC structure is illustrated in FIG. 3.

That is, a TB level CRC is first calculated using generator CRC-24B. The encoded frame is then segmented into multiple CBs. CRC attachment for each CB is then calculated with generator CRC-24A.

$CRC24A$: $g(D)=D24+D23+D18+D17+D14+D11+D10+D7+D6+D5+D4+D3+D+1$ $CRC24B$: $g(D)=D24+D23+D6+D5+D+1$

Figure 4:
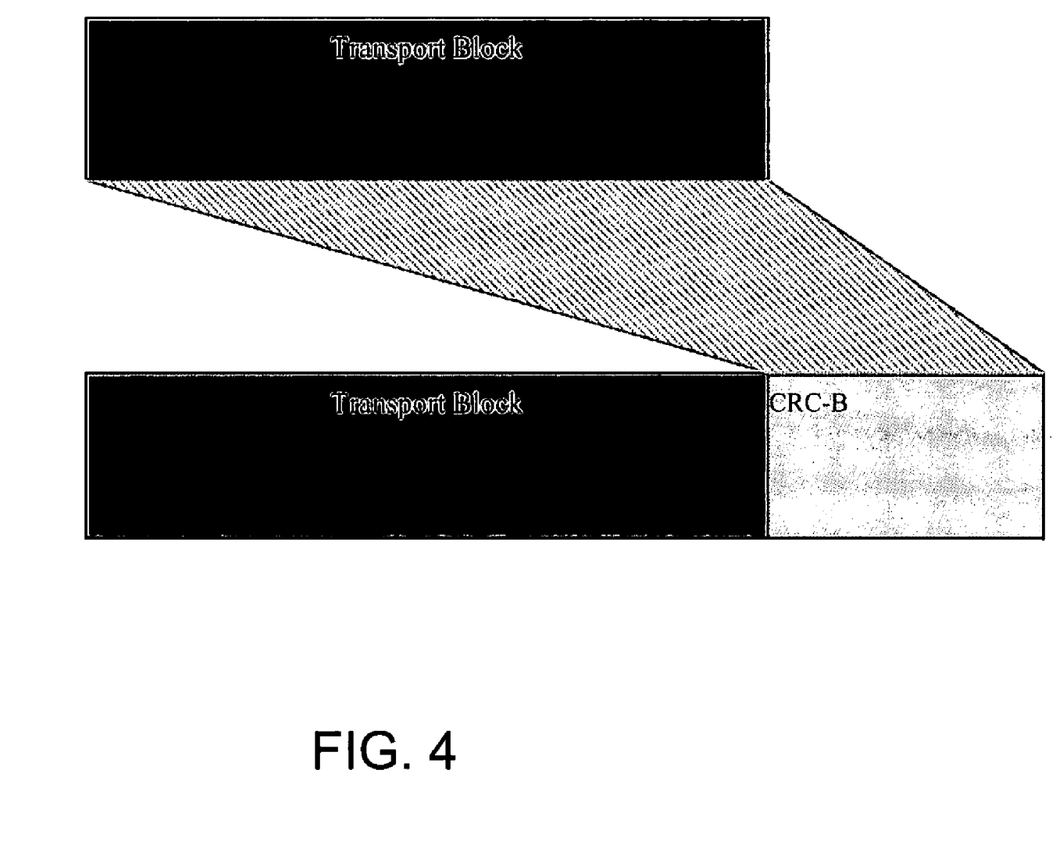

The shortcomings of the two-level CRC method become apparent when one tries to design turbo decoder hardware with early stopping capabilities. For a large TB that is segmented into multiple CBs as shown in FIG. 3, early stopping decision is assisted by CRC checking based on the CRC-24A generator. On the other hand, for a small TB that is not segmented as shown in FIG. 4, early stopping decision is assisted by CRC checking based on the CRC-24B generator.

It is hence necessary to tightly integrate two CRC checking circuits (one supporting CRC-24A and another supporting CRC-24B) into the turbo decoder hardware. Furthermore, additional controlling signals will be needed to modify the behavior of high-speed turbo decoding hardware. Both lead to high implementation and verification costs.

Thus, there is a need for method and arrangement that overcomes many of the disadvantages of known methods in order to provide computational efficiency and reduce hardware complexity.

SUMMARY

A method and apparatus for providing adaptive cyclic redundancy check (CRC) computation is disclosed. In one embodiment, transport block size is determined. Transport block (TB) CRC bits are computed with a first CRC generator when the TB size is less than or equal to a predetermined threshold. TB CRC bits are computed with a second CRC generator when the transport block size is greater than the predetermined threshold. When the TB is greater than the predetermined threshold, the TB is segmented into code blocks (CBs) and CB CRC bits are computed with the first CRC generator.

A method and apparatus for handling adaptively cyclic redundancy check (CRC) encoded transport blocks (TBs) is also disclosed. In one embodiment, a TB is received. The TB is CRC checked based on a first CRC generator when the TB size is less than or equal to a predetermined threshold. Code blocks of the TB are CRC checked based on the first CRC generator when the TB size is greater than the predetermined threshold. When the TB size is greater than the predetermined threshold, the code blocks are concatenated, and the TB is CRC checked based on a second CRC generator.

BRIEF DESCRIPTION OF THE DRAWINGS

In the following section, the invention will be described with reference to exemplary embodiments illustrated in the figures, in which.

DETAILED DESCRIPTION

Novel adaptive CRC encoding method is introduced to the transmitter side to simplify the hardware complexity on the receiver side. The design is also optimized based on the different error protection capabilities of the two CRC generator polynomials.

According to one embodiment, the CRC bits for the TB should be computed with an adaptively selected generator polynomial based on TB size. It should be clear to those skilled in the arts that the teaching of this invention can be applied to different systems with different sets of CRC generators and with different TB size thresholds. These variations are hence covered by the present invention.

Figure 5:
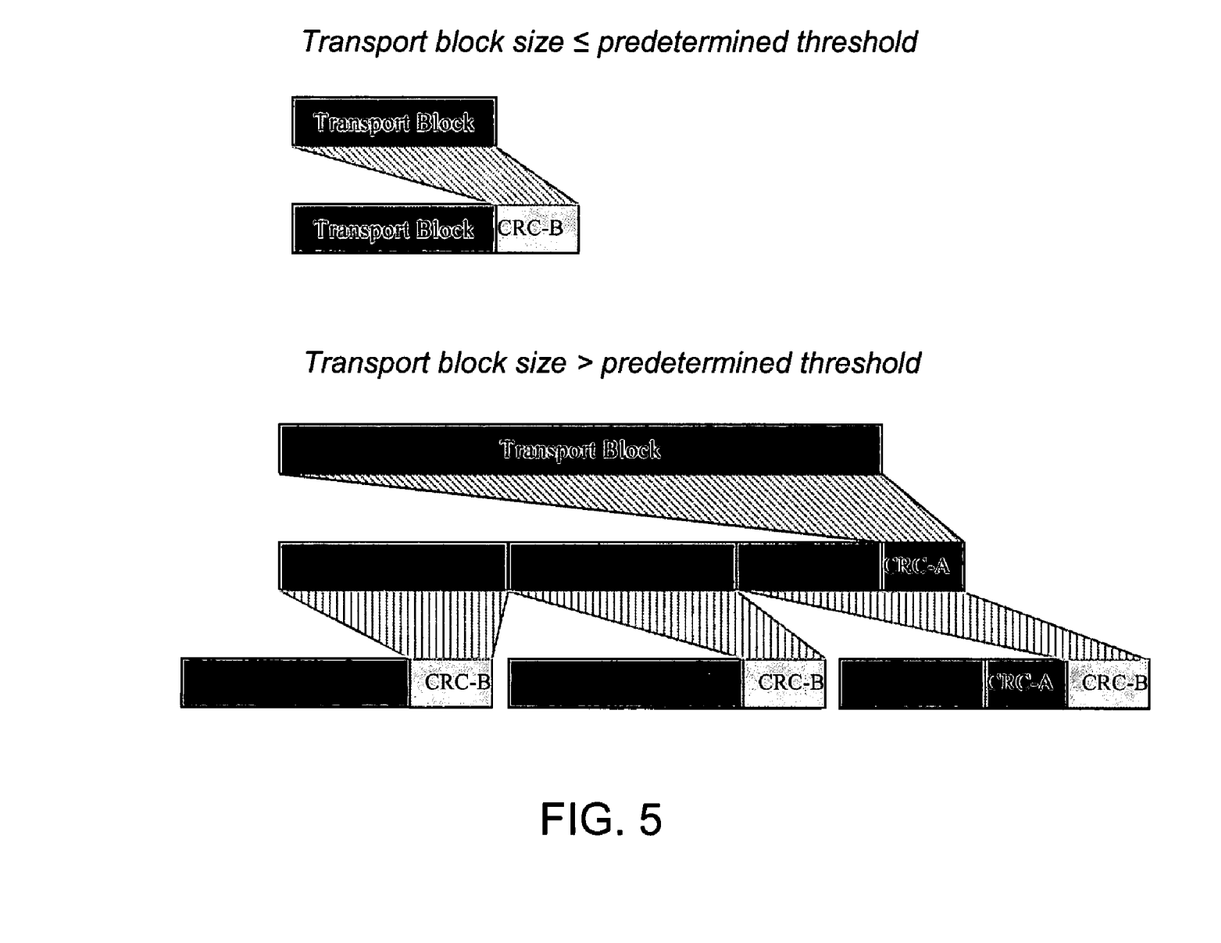
FIG. 5 illustrates a two level CRC structure in accordance with one embodiment.

FIG. 5 illustrates a CRC bit computation method in accordance with one embodiment. If the TB size is less than or equal to a predetermined threshold, the TB CRC bits are computed with generator CRC-24B. If the TB size is greater than the predetermined threshold, the TB CRC bits are computed with generator CRC-24A. The CB CRC bits are computed with generator CRC-24B.

In one non-limiting embodiment, the CRC computation method for the E-UTRA system is given by the following. If the TB size is smaller than or equal to 6120 bits, the TB CRC bits shall be computed with generator CRC-24B. If the TB size is greater than 6120 bits, the TB CRC bits shall be computed with generator CRC-24A. The CB CRC bits shall be computed with generator CRC-24B.

In another non-limiting embodiment, the CRC computation method for a WCDMA (Wideband Code Division Multiple Access) system where there is only TB CRC and no CB CRC is given by the following. If the TB size is smaller than or equal to 5090 bits, the TB CRC bits shall be computed with generator CRC-24B. If the TB size is greater than 5090 bits, the TB CRC bits shall be computed with generator CRC-24A.

Figure 6:
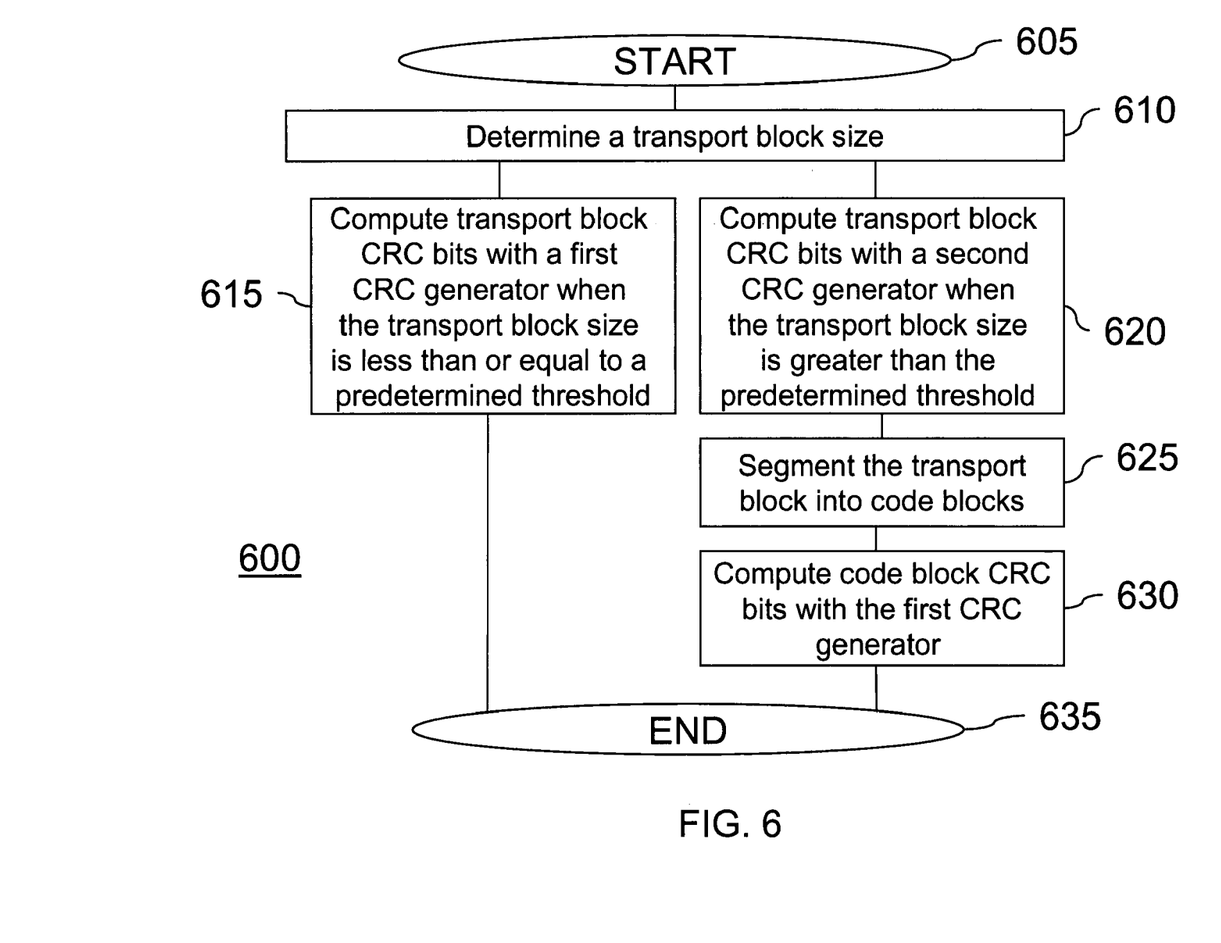
FIG. 6 illustrates a diagram of a method in accordance with one embodiment.

FIG. 6 illustrates a method 600 for providing adaptive CRC computation. More specifically, method 600 may be implemented in a CRC encoder. Method 600 starts at step 605. At step 610, transport block size is determined.

At step 615, transport block CRC bits are computed with a first CRC generator when the transport block size is less than or equal to a predetermined threshold.

At step 620, transport block CRC bits are computed with a second CRC generator when the transport block size is greater than the predetermined threshold. Since the transport block size is greater than the predetermined threshold, at step 625, the transport block is segmented into code blocks. At step 630, the code block CRC bits are computed with the first CRC generator. Method 600 ends at step 635.

In one embodiment, the first generator comprises a CRC-24B generator and the second generator comprises a CRC-24A generator. In another embodiment, the predetermined threshold for the TB is 6120 bits.

Figure 7:
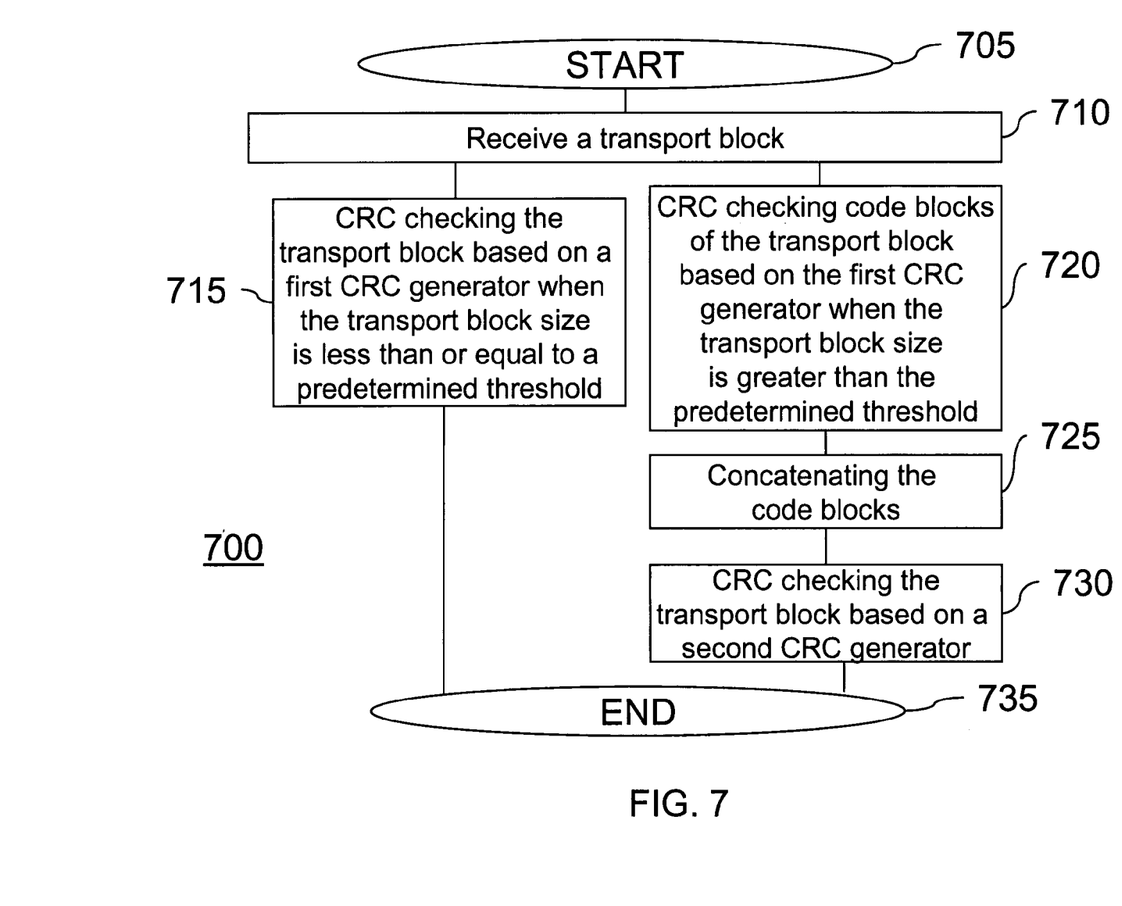
FIG. 7 illustrates a diagram of a method in accordance with one embodiment.

FIG. 7 illustrates a method 700 for handling adaptively CRC encoded transport blocks. More specifically, method 700 may be implemented in a CRC checker of a decoder. Method 700 starts at step 705. At step 710, a transport block is received.

CRC checking of the transport block based on a first CRC generator is performed at step 715 when the transport block size is less than or equal to a predetermined threshold.

CRC checking code blocks of the transport block based on the first CRC generator is performed at step 720 when the transport block size is greater than the predetermined threshold. The code blocks are concatenated at step 725. If all of the code blocks pass, the transport block CRC is checked. CRC checking of the transport block based on a second CRC generator is performed at step 730. Method 700 ends at step 735.

In one embodiment, the first generator comprises a CRC-24B generator and the second generator comprises a CRC-24A generator. In another embodiment, the predetermined threshold for the TB is 6120 bits.

Figure 8:
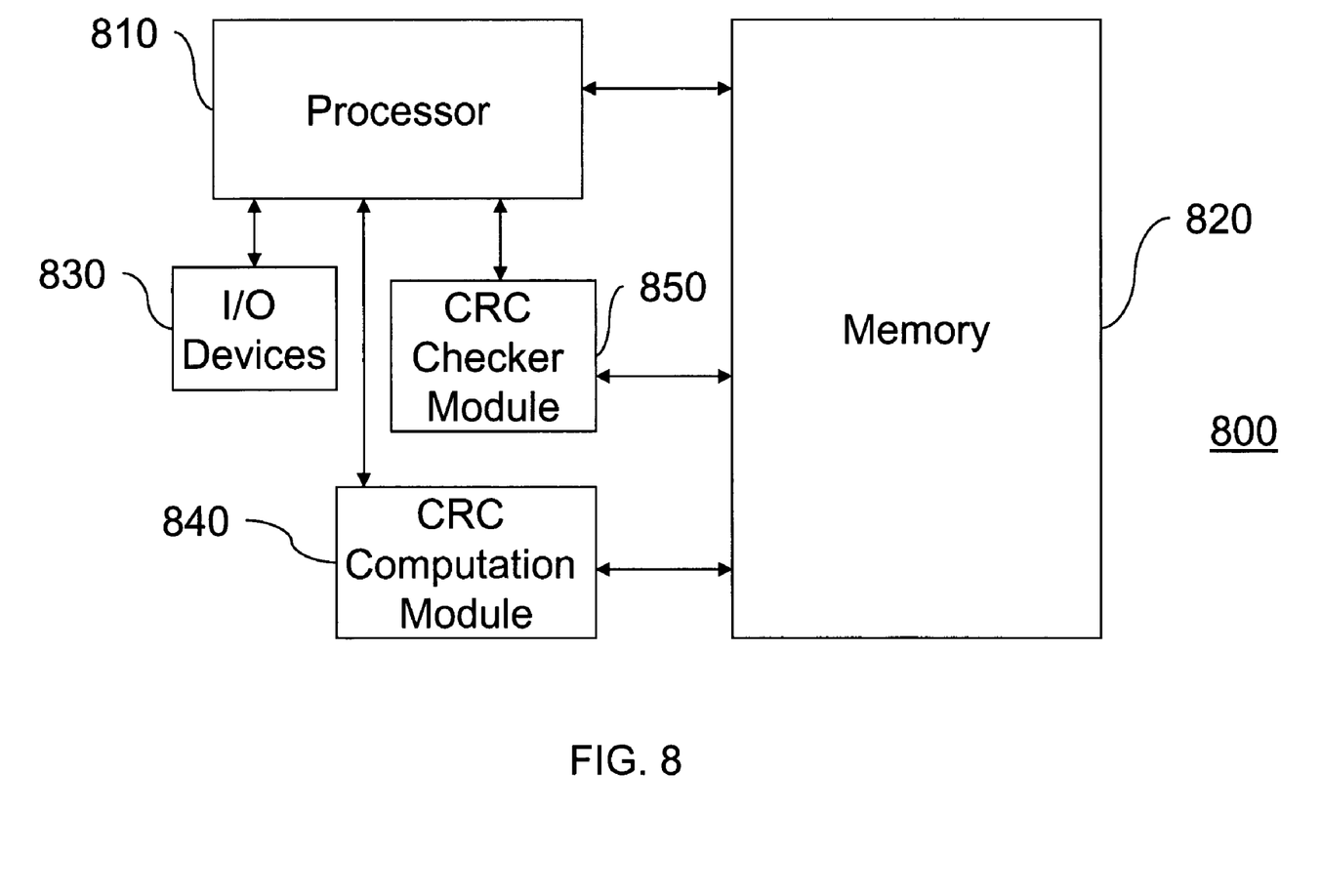
FIG. 8 illustrates a block diagram of a turbo encoder/decoder in accordance with one embodiment.

FIG. 8 illustrates a block diagram 800 of a turbo encoder/decoder of the present invention. Specifically, the system can be employed to provide a CRC computation module and CRC checker module. In one embodiment, turbo encoder/decoder 800 is implemented using a general purpose computer or any other hardware equivalents.

Thus, turbo encoder/decoder 800 comprises a processor (CPU) 810, a memory 820, e.g., random access memory (RAM) and/or read only memory (ROM), CRC computation module 840, CRC checker module 850 and various input/output devices 830, (e.g., storage devices, including but not limited to, a tape drive, a floppy drive, a hard disk drive or a compact disk drive, a receiver, a transmitter, a speaker, A/D and D/A converters.

It should be understood that CRC computation module 840 and CRC checker module 850 can be implemented as one or more physical devices that are coupled to the CPU 810 through a communication channel. Alternatively, CRC computation module 840 and CRC checker module 850 can be represented by one or more software applications (or even a combination of software and hardware, e.g., using application specific integrated circuits (ASIC)), where the software is loaded from a storage medium, (e.g., a magnetic or optical drive or diskette) and operated by the CPU in the memory 820 of the computer. As such, CRC computation module 840 and CRC checker module 850 (including associated data structures) of the present invention can be stored on a computer readable medium, e.g., RAM memory, magnetic or optical drive or diskette and the like.

An advantage of the present invention is that early stopping decisions for TBs of any sizes are assisted by CRC checking based on the CRC-24B generator. For a large TB that is segmented into multiple CBs as shown in FIG. 5, early stopping decision is assisted by CRC checking based on the CRC-24B generator. Similarly, for a small TB that is not segmented also shown in FIG. 5, early stopping decision is assisted by CRC checking based on the CRC-24B generator. Hence, only one CRC checking circuit is needed in the turbo decoder and no additional controlling circuit is needed.

Furthermore, embodiments of the present invention allow for optimization for different error protection capabilities of the two CRC generator polynomials. The CRC-24B generator is selected for small TBs because it has been shown to achieve better error detection performance in such cases. For large blocks, the two CRC generators, i.e., CRC-24B and CRC-24A, have identical error detection performance. It is hence possible to use the CRC-24A generator for large TBs.

As will be recognized by those skilled in the art, the innovative concepts described in the present application can be modified and varied over a wide range of applications. Accordingly, the scope of patented subject matter should not be limited to any of the specific exemplary teachings discussed above, but is instead defined by the following claims.

What is claimed is:

1. A method for providing adaptive cyclic redundancy check (CRC) computation, comprising:
   determining a transport block size;

computing transport block (TB) CRC bits with a first CRC generator when the TB size is less than or equal to a predetermined threshold;

computing TB CRC bits with a second CRC generator when the transport block size is greater than the predetermined threshold; and further comprising when the TB is greater than the predetermined threshold, segmenting the TB into code blocks (CBs);

computing CB CRC bits with the first CRC generator.

2. The method of claim 1, wherein the first generator comprises a CRC-24B generator.

3. The method of claim 1, wherein the second generator comprises a CRC-24A generator.

4. The method of claim 1, wherein the first generator comprises a CRC-24B generator and the second generator comprises a CRC-24A generator.

5. The method of claim 1, wherein an early stopping decision is assisted by CRC checking based on the first CRC generator.

6. The method of claim 5, wherein the first generator comprises a CRC-24B generator.

7. The method of claim 1, wherein the predetermined threshold comprises 6120 bits.

8. An apparatus for providing adaptive cyclic redundancy check (CRC) computation, comprising:
   an encoder configured to:
   determine a transport block size;
   compute transport block (TB) CRC bits with a first CRC generator when the TB size is less than or equal to a predetermined threshold;
   compute TB CRC bits with a second CRC generator when the transport block size is greater than the predetermined threshold; and
   further comprising when the TB size is greater than the predetermined threshold, segment the TB into code blocks (CBs);
   compute CB CRC bits with the first CRC generator.

9. The apparatus of claim 8, wherein the first generator comprises a CRC-24B generator.

10. The apparatus of claim 8, wherein the second generator comprises a CRC-24A generator.

11. The apparatus of claim 8, wherein the first generator comprises a CRC-24B generator and the second generator comprises a CRC-24A generator.

12. The apparatus of claim 8, wherein an early stopping decision is assisted by CRC checking based on the first CRC generator.

13. The apparatus of claim 12, wherein the first generator comprises a CRC-24B generator.

14. The apparatus of claim 8, wherein the predetermined threshold comprises 6120 bits.

15. A method for handling adaptively cyclic redundancy check (CRC) encoded transport blocks (TBs), comprising:
   receiving a TB;
   CRC checking the TB based on a first CRC generator when the TB size is less than or equal to a predetermined threshold;
   CRC checking code blocks of the TB based on the first CRC generator when the TB size is greater than the predetermined threshold; and
   further comprising when the TB size is greater than the predetermined threshold,
   concatenating the code blocks,
   CRC checking the TB based on a second CRC generator.

16. The method of claim 15, wherein only one CRC checker is needed in order to make an early stopping decision.

17. An apparatus for handling adaptively cyclic redundancy check (CRC) encoded transport blocks (TBs), comprising:
   a decoder configured to:
   receive a TB;
   CRC checking the TB based on a first CRC generator when the TB size is less than or equal to a predetermined threshold;
   CRC checking code blocks of the TB based on the first CRC generator when the TB size is greater than the predetermined threshold; and
   further comprising when the TB size is greater than the predetermined threshold, concatenating the code blocks, CRC checking the TB based on a second CRC generator.

18. The apparatus of claim 17, wherein only one CRC checker circuit is needed in order to make an early stopping decision.

* * * * *